US006852012B2

(12) United States Patent
Vepa et al.

(10) Patent No.: US 6,852,012 B2
(45) Date of Patent: Feb. 8, 2005

(54) CLUSTER TOOL SYSTEMS AND METHODS FOR IN FAB WAFER PROCESSING

(75) Inventors: Krishna Vepa, Livermore, CA (US); Duncan Dobson, Woodside, CA (US)

(73) Assignee: Wafer Solutions, Inc., Fremont, CA (US)

(*) Notice: Subject to any disclaimer, the term of this patent is extended or adjusted under 35 U.S.C. 154(b) by 482 days.

(21) Appl. No.: 09/808,749

(22) Filed: Mar. 15, 2001

(65) Prior Publication Data

US 2001/0027082 A1 Oct. 4, 2001

Related U.S. Application Data

(60) Provisional application No. 60/190,278, filed on Mar. 17, 2000, provisional application No. 60/190,221, filed on Mar. 17, 2000, and provisional application No. 60/202,495, filed on May 5, 2000.

(51) Int. Cl.[7] ................................................. B24B 1/00
(52) U.S. Cl. ............................ 451/41; 451/54; 451/59; 451/65; 451/67; 451/262; 451/269
(58) Field of Search ............................. 457/41, 54, 59, 457/65, 67, 262, 268, 269, 9, 10, 11

(56) References Cited

U.S. PATENT DOCUMENTS

| 5,476,566 A | 12/1995 | Cavasin |
| 5,972,234 A | 10/1999 | Weng et al. |
| 6,180,527 B1 | 1/2001 | Farnworth et al. |
| 6,309,279 B1 | 10/2001 | Bowman et al. |
| 6,376,395 B2 * | 4/2002 | Vasat et al. ................. 438/795 |
| 6,399,498 B1 | 6/2002 | Masumura et al. |
| 6,402,594 B1 | 6/2002 | Kobayashi et al. |
| 6,431,959 B1 * | 8/2002 | Mikhaylich et al. .......... 451/41 |
| 6,479,386 B1 | 11/2002 | Ng et al. |
| 6,491,836 B1 * | 12/2002 | Kato et al. .................... 216/88 |

FOREIGN PATENT DOCUMENTS

JP          63-134168 A      6/1988

* cited by examiner

*Primary Examiner*—Eileen P. Morgan
(74) *Attorney, Agent, or Firm*—Townsend and Townsend and Crew, LLP

(57) ABSTRACT

The present invention provides exemplary cluster tool systems and methods for processing wafers, such as semiconductor wafers. One method includes providing (710) a wafer having initial thickness variations between two wafer surfaces. The wafer is subjected to grinding (720), polishing (730) and cleaning (740) processes. The wafer is thereafter transferred (750) to a wafer processing chamber to undergo device formation processes (760–780). The wafer processing steps may be undertaken in a series of process modules of sufficiently small size to permit their use in a circuit device fabrication facility. The in-fab processing of wafers reduces the number of process steps, cost and time typically associated with wafer processing prior to device formation thereon.

19 Claims, 9 Drawing Sheets

CLUSTER TOOL SYSTEMS AND METHODS FOR IN FAB WAFER PROCESSING

CROSS-REFERENCES TO RELATED APPLICATIONS

This application claims the benefit of the following U.S. applications, the complete disclosures of which are incorporated herein by reference:

Provisional Application No. 60/190,278, filed on Mar. 17, 2000;

Provisional Application No. 60/190,221, filed on Mar. 17, 2000; and

Provisional Application No. 60/202,495, filed on May 5, 2000.

BACKGROUND OF THE INVENTION

The present invention is directed to the processing of wafers, substrates or disks, such as silicon wafers, and more specifically to cluster tool systems and methods for processing wafers prior to device formation.

Wafers or substrates with exemplary characteristics must first be formed prior to the formation of circuit devices. In determining the quality of the semiconductor wafer, the flatness of the wafer is a critical parameter to customers since wafer flatness has a direct impact on the subsequent use and quality of semiconductor chips diced from the wafer. Hence, it is desirable to produce wafers having as near a planar surface as possible.

In a current practice, cylindrical boules of single-crystal silicon are formed, such as by Czochralski (CZ) growth process. The boules typically range from 100 to 300 millimeters in diameter. These boules are cut with an internal diameter (ID) saw or a wire saw into disc-shaped wafers approximately one millimeter (mm) thick. The wire saw reduces the kerf loss and permits many wafers to be cut simultaneously. However, the use of these saws results in undesirable waviness of the surfaces of the wafer. For example, the topography of the front surface of a wafer may vary by as much as 1–2 microns ($\mu$) as a result of the natural distortions or warpage of the wafer as well as the variations in the thickness of the wafer across its surface. It is not unusual for the amplitude of the waves in each surface of a wafer to exceed fifteen (15) micrometers. The surfaces need to be made more planar (planarized) before they can be polished, coated or subjected to other processes.

FIG. 1 depicts a typical prior art method 10 for processing a silicon wafer prior to device formation. Method 10 includes a slice step 12 as previously described to remove a disc-shaped portion of wafer from the silicon boule. Once the wafer has been sliced, the wafer is cleaned and inspected (Step 14). Thereafter, an edge profile process (Step 16) is performed. Once the edge profile has been performed, the wafer is again cleaned and inspected (Step 18), and is laser marked (Step 20).

Next, a lapping process (Step 22) is performed to control thickness and remove bow and warp of the silicon wafer. The wafer is simultaneously lapped on both sides with an abrasive slurry in a lapping machine. The lapping process may involve one or more lapping steps with increasingly finer polishing grit. In another prior art method, a grinding process replaces the lapping procedure in FIG. 1. Problems incumbent with this process are further described in U.S. application Ser. No. 09/808,790, filed contemporaneously herewith, the complete disclosure of which is incorporated herein by reference.

The wafer is then cleaned (Step 24) and etched (Step 26) to remove damage caused by the lapping process. The etching process may involve placing the wafer in an acid bath to remove the outer surface layer of the wafer. Typically, the etchant is a material requiring special handling and disposal. Thereafter, an additional cleaning of the wafer (Step 28) is performed.

The prior art method continues with a donor anneal (Step 30) followed by wafer inspection (Step 32). Thereafter, the wafer edge is polished (Step 24) and the wafer is again cleaned (Step 36). Typical wafer processing involves the parallel processing of a multitude of wafers. Hence at this juncture wafers may be sorted, such as by thickness (Step 38), after which a double side polish process is performed (Step 40).

The wafers then are cleaned (Step 42) and a final polish (Step 44) is performed. The wafers are again cleaned (Step 46), inspected (Step 48) and potentially cleaned and inspected again (Steps 50 and 52). For epitaxial substrates, a poly or oxide layer is overlaid to seal in the dopants after inspection Step 52. At this point, the wafer is packed (Step 54), shipped (Step 56) and delivered to the end user (Step 58). Hence, as seen in FIG. 1 and as described above, typical wafer processing involves a lengthy, time consuming process with a large number of processing steps.

A number of deficiencies exist with the prior art method. As can be seen from even a precursory review of FIG. 1, the prior art method requires a large number of steps to transform a wafer slice into a substrate suitable for creating circuit devices. The large number of process steps involved negatively effects production throughput, requires a large production area, and results in high fabrication costs. Additionally, each of the steps in FIG. 1 are typically performed at individual process stations. The stations are not grouped or clustered together, and manual delivery of the wafers between stations is often used.

Additionally, the large production area required results in the need for a separate facility for the wafer processing described in FIG. 1 than for device formation on the wafer. To produce integrated circuits and other devices from the wafers, the wafers are packed, shipped and delivered to the appropriate fabrication facility. Upon receipt by the fabrication facility, the wafers must be received, unpacked, inspected and delivered to a wafer processing chamber for subsequent process steps necessary for device formation. These additional processing and delivering steps add to the complexity and cost of wafer processing prior to device fabrication. Unfortunately, to date, separate facilities are required due at least in part to the large area needed for FIG. 1 processing. As a result, small volume manufacturing of wafers is difficult.

In addition to the large number of process steps, at least some of the prior art steps themselves are slow or produce unacceptable results. For example, compared to a grinding process, the lapping process is slow and must be followed by careful cleaning and etching steps to relieve stresses before the wafer is polished. These additional steps cause the conventional method to be more expensive and time-consuming than methods of the present invention. Also, the etching process employed after the lapping step is undesirable from an environmental standpoint, because the large amount of strong acids used must be disposed of in an acceptable way.

Additional deficiencies in the current art, and improvements in the present invention, are described below and will be recognized by those skilled in the art.

SUMMARY OF THE INVENTION

The present invention provides exemplary cluster tool systems and methods for processing wafers, such as semiconductor wafers. One method of the present invention includes providing a wafer having initial thickness variations between two wafer surfaces. The wafer is processed through a first module, with the first module having apparatus for performing a grinding process, and where processing through the first module includes performing the grinding process. The wafer is processed through a second module having apparatus for performing a double side polish (DSP) process. Processing the wafer through the second module includes performing a DSP process. The wafer is processed through a third module having an apparatus for performing a finish polish process, with processing therethrough including the finish polish process.

The method further includes cleaning the wafer after processing through the third module, and thereafter transferring the wafer to a wafer processing chamber within a same facility as that containing the first, second and third modules. In this manner, initial wafer processing occurs in the same facility as circuit device formation. Circuit device formation includes a myriad of processes know to those skilled in the art, including the deposition or formation of dielectric layers or conductive layers, etching processes, thermal oxidation and the like. Exemplary processing chambers include the Centura platform and the Endura platform, available from Applied Materials, Inc. in Santa Clara, Calif.

In one embodiment, the first and/or second modules each comprise a cluster tool defining a clean room environment. In one aspect, the method further includes testing wafer metrology and transferring the wafer to the wafer processing chamber only if the wafer has a desired flatness profile. In this manner, only wafers suitable for device formation are transferred to the wafer processing chamber. In another aspect, the wafer has a total thickness variation (TTV) between the two surfaces of less than about 0.3 microns, and/or a SFQR of less than about 0.12 microns, prior to transferring to the wafer processing chamber. In one embodiment, the method further includes performing a circuit device fabrication process, such as the deposition of a dielectric or conductive layer, on the wafer within the processing chamber.

In one aspect, the first module has a footprint between about ninty (90) square feet (sqft) and about one hundred and fifty (150) sqft, and has a capacity of processing between about twenty-nine (29) and about thirty-three (33) 300 mm wafers therethrough per hour. In another aspect, the second module has a footprint between about one hundred (100) square feet (sqft) and about one hundred and eighty (180) sqft, and has a capacity of processing between about twenty nine (29) and about thirty-three (33) 300 mm wafers therethrough per hour. In still another aspect, the third module has a footprint between about one hundred (100) square feet (sqft) and about one hundred and eighty (180) sqft, and has a capacity of processing between about twenty nine (29) and about thirty-three (33) 300 mm wafers therethrough per hour. In this manner, the process modules are sufficiently compact in size, with appropriate throughput, to be co-located in a circuit device fabrication facility with circuit device processing chambers and other equipment.

In another embodiment of the present invention, a method of processing a wafer prior to device formation thereon includes providing a wafer having first and second surfaces with thickness variations therebetween. The method includes grinding the first and second wafer surfaces, polishing the first and second wafer surfaces, cleaning the wafer, and thereafter transferring the wafer to a wafer processing chamber.

In one aspect, the wafer polishing, cleaning and transferring all occur in a single wafer fabrication facility. In another aspect, the wafer is transferred to the wafer processing chamber with a robot. In alternative embodiments, the method further includes depositing a dielectric layer and/or a conductive layer on the wafer within the processing chamber. In this manner, wafer fabrication and device fabrication take place in a single fabrication facility.

In still another aspect, the wafer is cleaned and then transferred, with the cleaning and transferring adapted to provide the wafer to the processing chamber in a wafer condition sufficient for forming an integrated circuit device thereon. In another aspect, the method further includes defining a wafer edge profile after wafer grinding.

The compact nature of the cluster tools according to the present invention facilitate their use within a fabrication facility, such as a circuit device fabrication facility. In this manner, packing, shipping and delivery steps as shown in FIG. 1 are avoided. Additionally, unpacking, inspecting and cleaning steps may be avoided at the device fabrication facility since the wafer can be delivered directly to the processing chamber.

Other objects, features and advantages of the present invention will become more fully apparent from the following detailed description, the appended claims and the accompanying drawings.

DESCRIPTION OF THE SPECIFIC EMBODIMENTS

Figure 2:
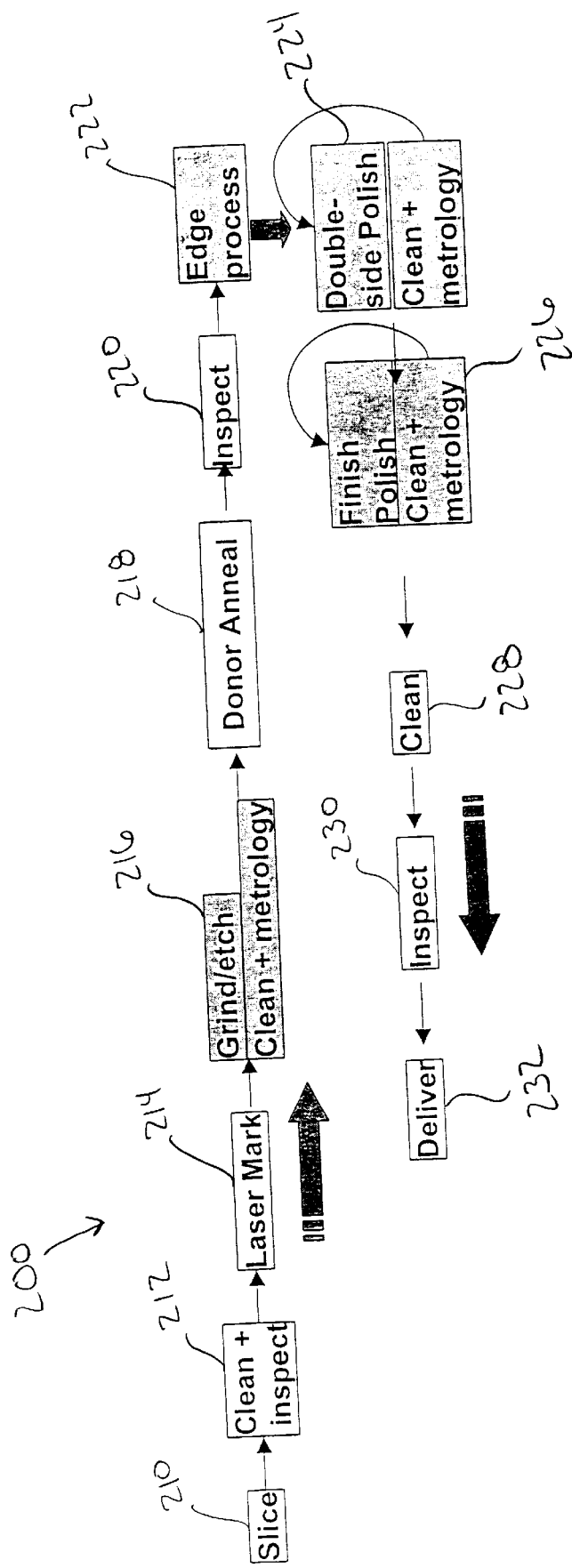
FIG. 2 is a simplified flow diagram of a wafer processing method according to the present invention.

FIG. 2 depicts an exemplary method 200 of the present invention. Method 200 includes a slice process 210, using a wire saw, inner diameter saw or the like, to create a generally disc-shaped wafer or substrate. In one embodiment, the wafer is a silicon wafer. Alternatively, the wafer may comprise polysilicon, germanium, glass, quartz, or other materials. Further, the wafer may have an initial diameter of about 200 mm, about 300 mm, or other sizes, including diameters larger than 300 mm.

The wafer is cleaned and inspected (Step 212) and then may, or may not, be laser-marked (Step 214). Laser marking involves creating an alphanumeric identification mark on the wafer. The ID mark may identify the wafer manufacturer, flatness, conductivity type, wafer number and the like. The laser marking preferably is performed to a sufficient depth so that the ID mark remains even after portions of the wafer have been removed by subsequent process steps such as grinding, etching, polishing, and the like.

Thereafter, the wafer is processed through a first module (Step 216), with details of embodiments of the first module described below in conjunction with FIGS. 3A–3C. First module processing (Step 216) includes a grinding process, an etching process, a cleaning process and metrology testing of the wafer. In this module, the use of a grinding process in lieu of lapping helps to remove wafer bow and warpage. The grinding process of the present invention also is beneficial in removing wafer surface waves caused by the wafer slicing in Step 210. Benefits of grinding in lieu of lapping include reduced kerf loss, better thickness tolerance, improved wafer shape for polishing and better laser mark dot depth tolerance, and reduced damage, among others.

Figure 1:
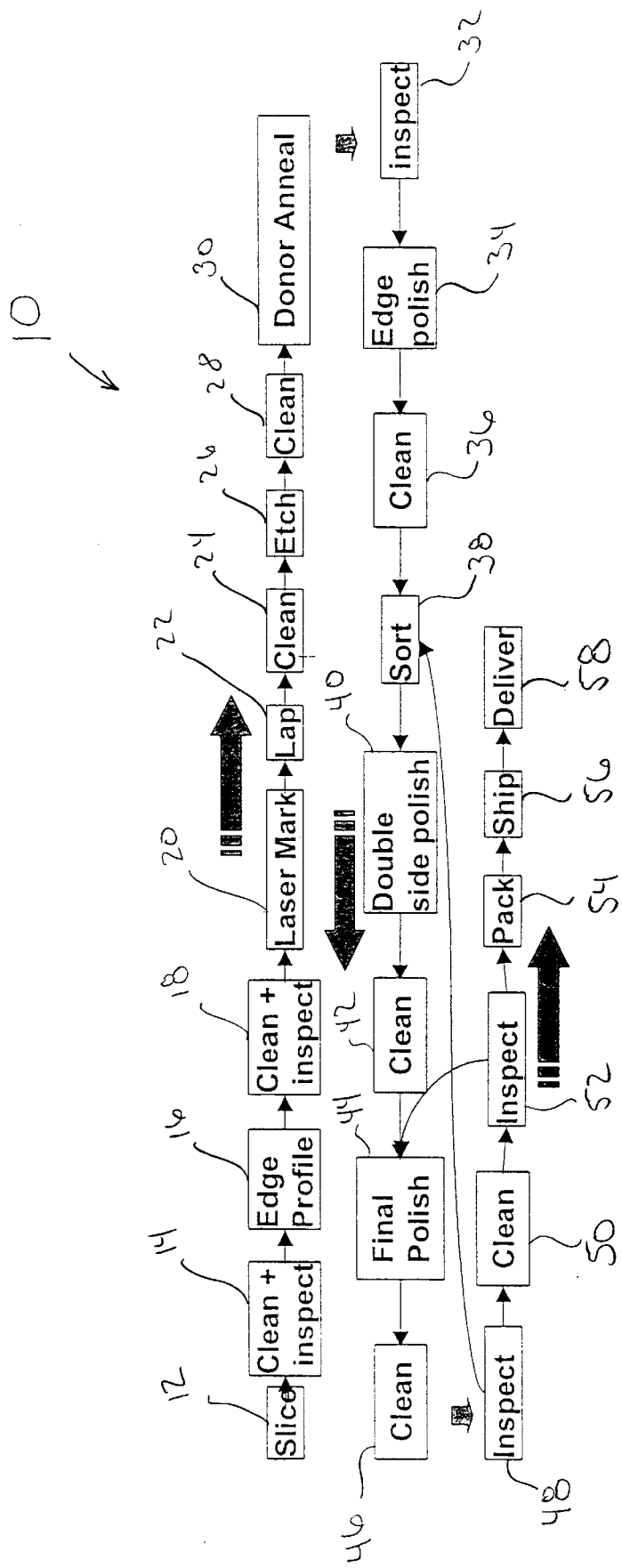
FIG. 1 depicts a prior art method for processing a silicon wafer.

The etching process within the first module is a more benign process than the prior art etch step described in conjunction with FIG. 1. For example, typical prior art etching (Step 26 in FIG. 1) may involve the bulk removal of forty (40) or more microns of wafer thickness. In contrast, the etch process of the present invention preferably removes ten (10) microns or less from the wafer thickness. In one embodiment, the first module etch process removes between about two (2) microns to about five (5) microns of wafer material per side, or a total of about four (4) to about ten (10) microns. In another embodiment, the first module etch process removes between about three (3) microns and about four (4) microns of wafer material per side for a total of about six (6) to about (8) microns.

After first module processing, the wafer is subjected to a donor anneal (Step 218) and thereafter inspected (Step 220). The donor anneal removes unstable oxygen impurities within the wafer. As a result, the original wafer resistivity may be fixed. In an alternative embodiment, donor anneal is not performed.

The wafer then is processed through a second module (Step 222) in which an edge process is performed. The edge process includes both an edge profile and an edge polish procedure. Edge profiling may include removing chips from the wafer edge, controlling the diameter of the wafer and/or the creation of a beveled edge. Edge profiling also may involve notching the wafer to create primary and secondary flat edges. The flats facilitate wafer alignment in subsequent processing steps and/or provide desired wafer information (e.g., conductivity type). In one embodiment, one or both flats are formed near the ID mark previously created in the wafer surface. One advantage of the present invention involves performing the edge profiling after wafer grinding. In this manner, chips or other defects to the wafer edge, which may arise during grinding or lapping, are more likely to be removed. Prior art edge profiling occurs before lapping, and edge polishing subsequent to the lapping step may not sufficiently remove edge defects.

The wafer is then processed through a third module (Step 224). A third module process includes a double side polish, a cleaning process and wafer metrology. Wafer polishing is designed to remove stress within the wafer and smooth any remaining roughness. The polishing also helps eliminate haze and light point defects (LPD) within the wafer, and produces a flatter, smoother finish wafer. As shown by the arrow in FIG. 2, wafer metrology may be used to adjust the double side polishing process within the third module. In other words, wafer metrology may be feed back to the double side polisher and used to adjust the DSP device in the event the processed wafer needs to have different or improved characteristics, such as flatness, or to further polish out scratches.

Thereafter, the wafer is subjected to a finish polish, a cleaning process and metrology testing, all within a fourth process module (226). The wafer is cleaned (Step 228), inspected (Step 230) and delivered (Step 232).

The reduced number of clean and inspection steps, particularly near the end of the process flow, are due in part to the exemplary metrology processing of the wafer during prior process steps. Wafer metrology testing may test a number of wafer characteristics, including wafer flatness, haze, LPD, scratches and the like. Wafer flatness may be determined by a number of measuring methods known to those skilled in the art. For example, "taper" is a measurement of the lack of parallelism between the unpolished back surface and a selected focal plane of the wafer. Site Total Indicated Reading (STIR) is the difference between the highest point above the selected focal plane and the lowest point below the focal plane for a selected portion (e.g., 1 square cm) of the wafer, and is always a positive number. Site Focal Plane Deviation (SFPD) is the highest point above, or the lowest point below, the chosen focal plane for a selected portion (e.g., 1 square cm) of the wafer and may be a positive or negative number. Total thickness variation (TTV) is the difference between the highest and lowest elevation of the polished front surface of the wafer.

Further, metrology information, in one embodiment, is fed back and used to modify process parameters. For example, in one embodiment metrology testing in the first module occurs after wafer grinding and may be used to modify the grinding process for subsequent wafers. In one embodiment, wafers are processed through the first module in series. More specifically, each station within the first module processes a single wafer at a time. In this manner, metrology information may be fed back to improve the grinding or other process after only about one (1) to five (5) wafers have been processed. As a result, a potential problem can be corrected before a larger number of wafers have been processed through the problem area, thus lowering costs.

Further, the present invention produces standard process times for each wafer. More specifically, each wafer is subjected to approximately the same duration of grinding, cleaning, etching, etc. The delay between each process also is the same or nearly the same for each wafer. As a result, it is easy to troubleshoot within the present invention methods and systems.

In contrast, prior art methods typically uses a batch process mode for a number of process steps. For example, a batch containing a large number of wafers (say, twenty (20)) may be lapped one to a few at a time (say, one (1) to four (4) at a time). After all twenty have been lapped, the batch of twenty wafers then are cleaned together as a group (Step 24), and etched together as a group (Step 26). As a result, the wafers that were lapped first sit around for a longer period of time prior to cleaning than do the wafers lapped last. This varying delay effects wafer quality, due in part to the formation of a greater amount of haze, light point defects, and other time-dependent wafer defects. One negative outcome of irregular process times is the resultant difficulty in locating potential problems within the process system.

As with the first module, metrology information may be fed back within the second, third and fourth modules. For example, metrology information may be fed back to the double side polisher or finish polisher to adjust those processes to produce improved results. Additionally, in one embodiment, metrology information is fed back within the third and/or fourth module in real time. As a result, process steps such as the double side polishing can be modified during processing of the same wafer on which metrology testing has occurred.

With reference to FIGS. 3–6, additional details on process modules according to the present invention will be provided. It will be appreciated by those skilled in the art that the process modules described in FIGS. 3–6 are embodiments of the present invention from which a large number of variations for each module exist within the scope of the present invention. Further, additional process steps may be removed or added, and process steps may be rearranged within the scope of the present invention.

Figure 3A:
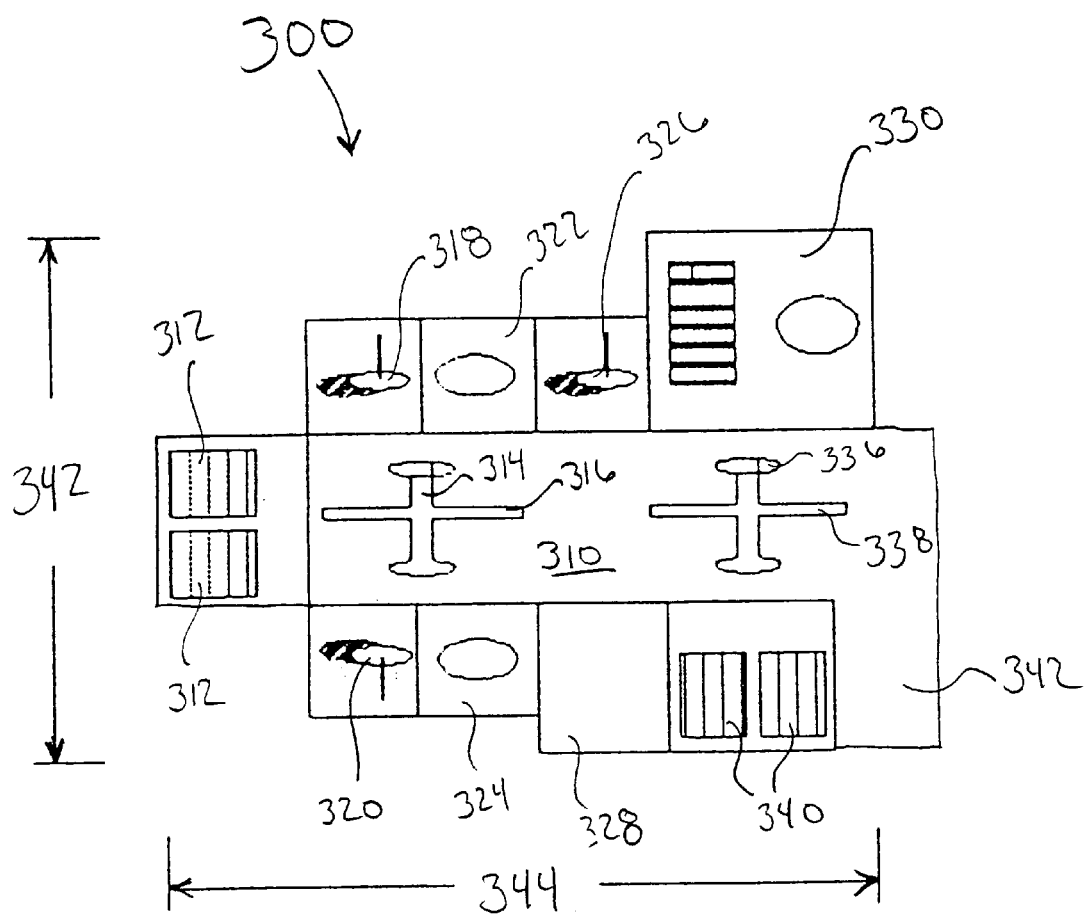
FIGS. 3A–C depict grind damage cluster tools according to the present invention.

FIG. 3A depicts a grind damage cluster module described as first module 216 in conjunction with FIG. 2. First module 300 defines a clean room environment 310 in which a series of process steps are carried out. Wafers that have been processed through Step 214 (FIG. 2) are received in first module 300 via a portal, such as a front opening unified pod (FOUP) 312. First module 300 is shown with two FOUPs 312, although a larger or smaller number of FOUPs/portals may be used. FOUPs 312 are adapted to hold a number of wafers so that the frequency of ingress into the clean room environment 310 may be minimized. A transfer device 314, schematically depicted as a robot, operates to remove a wafer from FOUPs 312 and place the wafer on a grinder 318. If needed, transfer device 314 travels down a track 316 to properly align itself, and hence the wafer, in front of grinder 318. Grinder 318 operates to grind a first side of the wafer.

The wafer may be held down on grinder 318 by way of a vacuum chuck, and other methods. Once grinder 318 has ground the first side of the wafer, the wafer is cleaned in cleaner 322 and the transfer device 314 transfers the wafer back to grinder 318 for grinding the converse side of the wafer. In one embodiment, wafer grinding of both wafer sides removes about forty (40) microns to about seventy (70) microns of wafer thickness. After the second wafer side is ground, the wafer is again cleaned in cleaner 322. In one embodiment, cleaning steps occur on grinder 318 subsequent to grinding thereon. In one embodiment, cleaning and drying are accomplished by spraying a cleaning solution on the wafer held by or near the edges and spun.

In another embodiment, at least one side of the wafer is subjected to two sequential grinding steps on grinder 318. The two grinding processes preferably include a coarse grind followed by a fine grind. Grinder 318 may include, for example, two different grinding platens or pads with different grit patterns or surface roughness. In one embodiment, the wafer is cleaned on grinder 318 between the two grinding steps to the same wafer side. Alternatively, cleaning may occur after both grinding steps to the same wafer side.

In some embodiments, transfer device 314 transfers the wafer from cleaner 322 to a backside polisher 326. For example, this process flow may occur for 200 mm wafers. In this embodiment, the back side is polished and not ground, or both ground and polished.

As shown in FIG. 3A, a second grinder 320 and a second cleaner 324 are provided within module 300. In this manner, two wafers may be simultaneously processed therethrough. Since both grinders 318, 320 have a corresponding cleaner 322, 324, wafer processing times are consistent even if two wafers are being ground simultaneously on grinders 318, 320. In one embodiment, grinders 318 and 320 are used to grind opposite sides of the same wafer. In this case, one side of the wafer is ground on grinder 318 and the other side of the same wafer is ground on grinder 320. As with grinder 318, wafers may be ground on grinder 320 and then cleaned on grinder 320 before removal, or cleaned in cleaner 324.

Once the wafers have been ground, a second transfer device 336, again a robot in one embodiment, operates to transfer the wafer to an etcher 330. Etcher 330 operates to remove material from the wafer, preferably a portion on both primary sides of the wafer. The etching process is designed to remove stresses within the silicon crystal caused by the grinding process. Such an operation, in one embodiment, removes ten (10) microns or less of total wafer thickness. In this manner, etcher 330 operates to remove less wafer material than in prior art etch processes. Further, the present invention requires less etchant solution, and hence poses fewer environmental problems related to disposal of the acids or other etchants.

Wafer metrology is then tested at a metrology station 328. In one embodiment wafer metrology is tested subsequent to grinding on grinder 318, and prior to the etching within etcher 330. Alternatively, wafer metrology is tested subsequent to etching in etcher 330. In still another embodiment, wafer metrology is tested both prior to and subsequent to the etching process. Evaluation of wafer metrology involves the testing of wafer flatness and other wafer characteristics to ensure the wafer conforms to the desired specifications. If the wafer does not meet specifications, the wafer is placed in a recycle area 342, which in one embodiment comprises a FOUP 342 (not shown in FIG. 3A). Wafers with acceptable specifications are placed in an out portal or FOUP 340 for removal from first module 300.

As shown and described in conjunction with FIG. 3A, first module 300 provides an enclosed clean room environment in which a series of process steps are performed. Wafers are processed in series through first module 300. Hence, each wafer has generally uniform or uniform process time through the module as well as generally uniform or uniform delay times between process steps. Further, by immediately cleaning and etching the wafer after grinding, the formation of haze and light point defects (LPD) within the wafer are reduced. Such a module configuration is an improvement over the prior art in which wafers are typically processed during the lapping step in batch mode. As a result, some wafers will wait longer before the cleaning or etching steps than others within the same batch. As a result, haze and other wafer defects vary from wafer to wafer, even between wafers within the same batch. Such a shortcoming of the prior art can make it difficult if not impossible to isolate problems within the wafer process flow in the event defective wafers are discovered.

An additional benefit of first module 300 is its compact size. In one embodiment, module 300 has a width 342 that is about 9 feet 3 inches and a length 344 that is about 12 feet 6 inches. In one embodiment, first module 300 has a footprint between about ninty (90) square feet and about one hundred and fifty (150) square feet. It will be appreciated by those skilled in the art that the width and length, and hence the footprint of first module 300, may vary within the scope of the present invention. For example, additional grinders 318, 320 may be added within first module 300 to increase the footprint of module 300. In one embodiment, first module 300 is adapted to process about thirty (30) wafers per hour. In another embodiment, first module 300 is adapted to process between about twenty-nine (29) and about thirty-three (33) 300 mm wafers per hour.

Figure 3B:
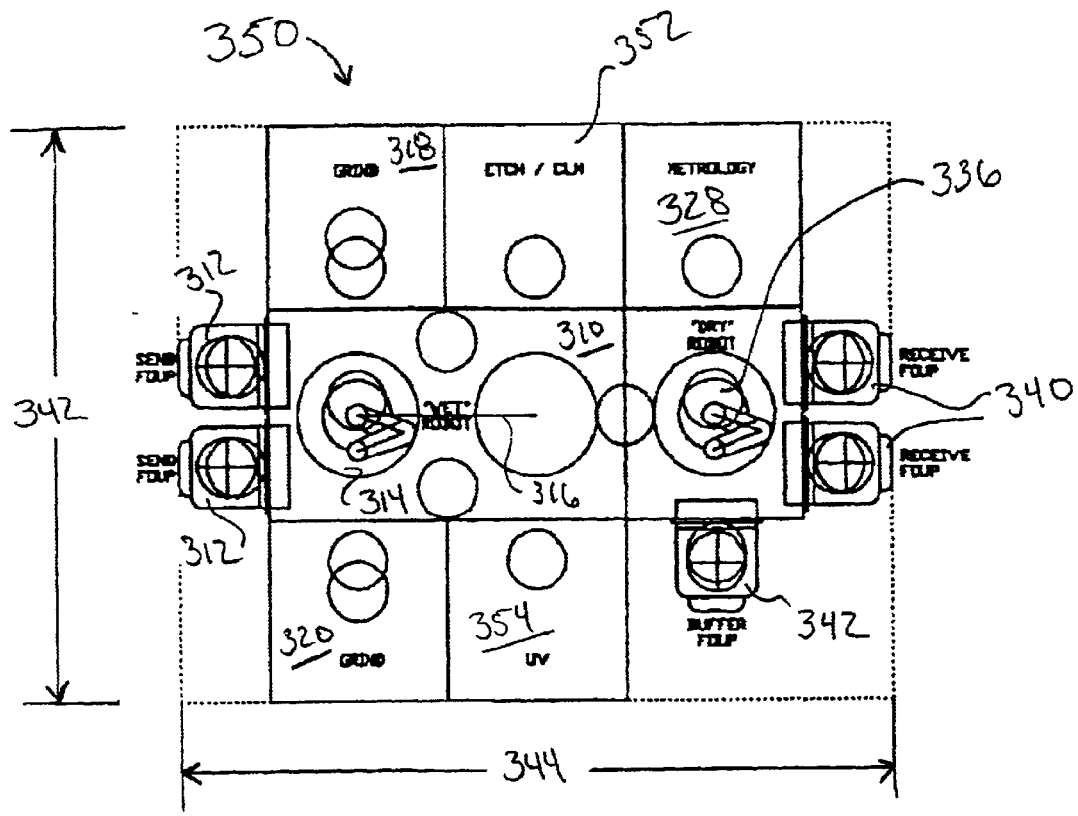

FIG. 3B depicts an alternative embodiment of a grind damage cluster module according to the present invention. Again, the grind damage cluster module 350 may correspond to first module 216 described in conjunction with FIG. 2. Module 350 includes many of the same components as the embodiment depicted in FIG. 3A, and like reference numerals are used to identify like components. Module 350 receives wafers or substrates to be processed at portal 312, identified as a send FOUP 312 in FIG. 3B. Wafers are transferred by transfer device 314, shown as wet robot 314, to a preprocessing station 354. In one embodiment, transfer device 314 travels on a track, groove, raised member or other mechanism which allows transfer device 314 to reach several process stations within module 350.

At preprocessing station 354, a coating is applied to one side of the wafer. In one embodiment, a polymer coating is spun on the wafer to provide exemplary coverage. This coating then is cured using ultraviolet (UV) light to provide a low shrink, rapid cured coating on one side of the wafer. In addition to UV curing, curing of the coating may be accomplished by heating and the like. In a particular embodiment, the coating is applied to a thickness between about five (5) microns and about thirty (30) microns.

Once cured, the coating provides a completely or substantially tack free, stress free surface on one side of the wafer. In one embodiment of the present invention, transfer device 314 transfers the wafer to grinder 318, placing the polymer-coated side down on the grinder 318 platen. In one embodiment, the platen is a porous ceramic chuck which uses a vacuum to hold the wafer in place during grinding. The waves created during wafer slicing are absorbed by the coating and not reflected to the front side of the wafer when held down during the grinding process. After the first wafer side is ground on grinder 318, the wafer is flipped over and the second side is ground. As described in conjunction with FIG. 3A, an in situ clean of the wafer may occur before turning the wafer, or the wafer may be cleaned subsequent to grinding of both sides. Again, the second side grinding may occur on grinder 318 or grinder 320. Grinding of the second side removes the cured polymer, and a portion of the second wafer surface resulting in a generally smooth wafer on both sides, with little to no residual surface waves. Additional details of exemplary grinding processes are further described in U.S. application Ser. No. _____, filed contemporaneously herewith, the complete disclosure of which is incorporated herein by reference.

After grinding on grinder 318 and/or 320, the wafer is transferred to a combined etch/clean station 352 for wafer etch. Again, wafer etching in station 352 removes a smaller amount of wafer material, and hence requires a smaller amount of etchant solutions, than is typically required by prior art processes.

Processing continues through module 350 ostensibly as described in FIG. 3A. The wafer metrology is tested at metrology station 328. Wafers having desired characteristics are transferred by transfer device 336, shown as a dry robot, to out portals 340, identified as receive FOUPS 340 in FIG. 3B. Wafers having some shortcoming or undesirable parameter are placed in a recycle area 342, shown as a buffer FOUP 342, for appropriate disposal.

In one embodiment, module 350 has a width 342 at its widest point of about one hundred and fourteen (114) inches, and a length at its longest point of about one hundred and forty-five inches (145), with a total footprint of about one hundred and fourteen square feet (114 sqft). As will be appreciated by those skilled in the art, the dimensions and footprint of module 350 may vary within the scope of the present invention.

Figure 3C:
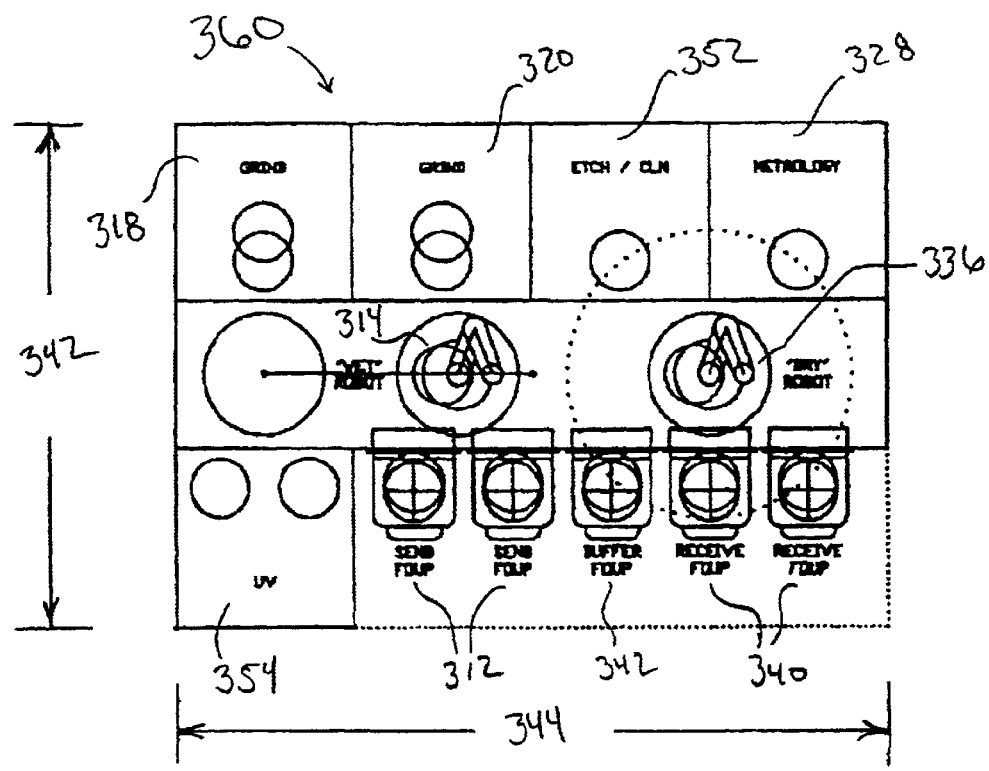

Still another embodiment of a grind damage cluster module according to the present invention is shown in FIG. 3C. FIG. 3C depicts a first module 360 having similar stations and components as module 350 described in FIG. 3B. However, module 350 is a flow through module, with wafers being received at one end or side of module 350 and exiting an opposite end or side of module 350. Module 360 has FOUPS 312, 342 and 340 grouped together. Such a configuration provides a single entry point into module 360, and hence into clean room environment 310. Transfer devices 314 and 336 again facilitate the movement of wafers from station to station within module 360. As shown in FIGS. 3B and 3C, transfer device 314 travels on mechanism 316, as discussed in conjunction with FIG. 3B. Transfer device 336 operates from a generally fixed position with arms or platens extending therefrom to translate the wafer to the desired processing station. Module 360 further includes station 354 for application of a wafer coating, such as the UV cured polymer coating described above.

Figure 4:
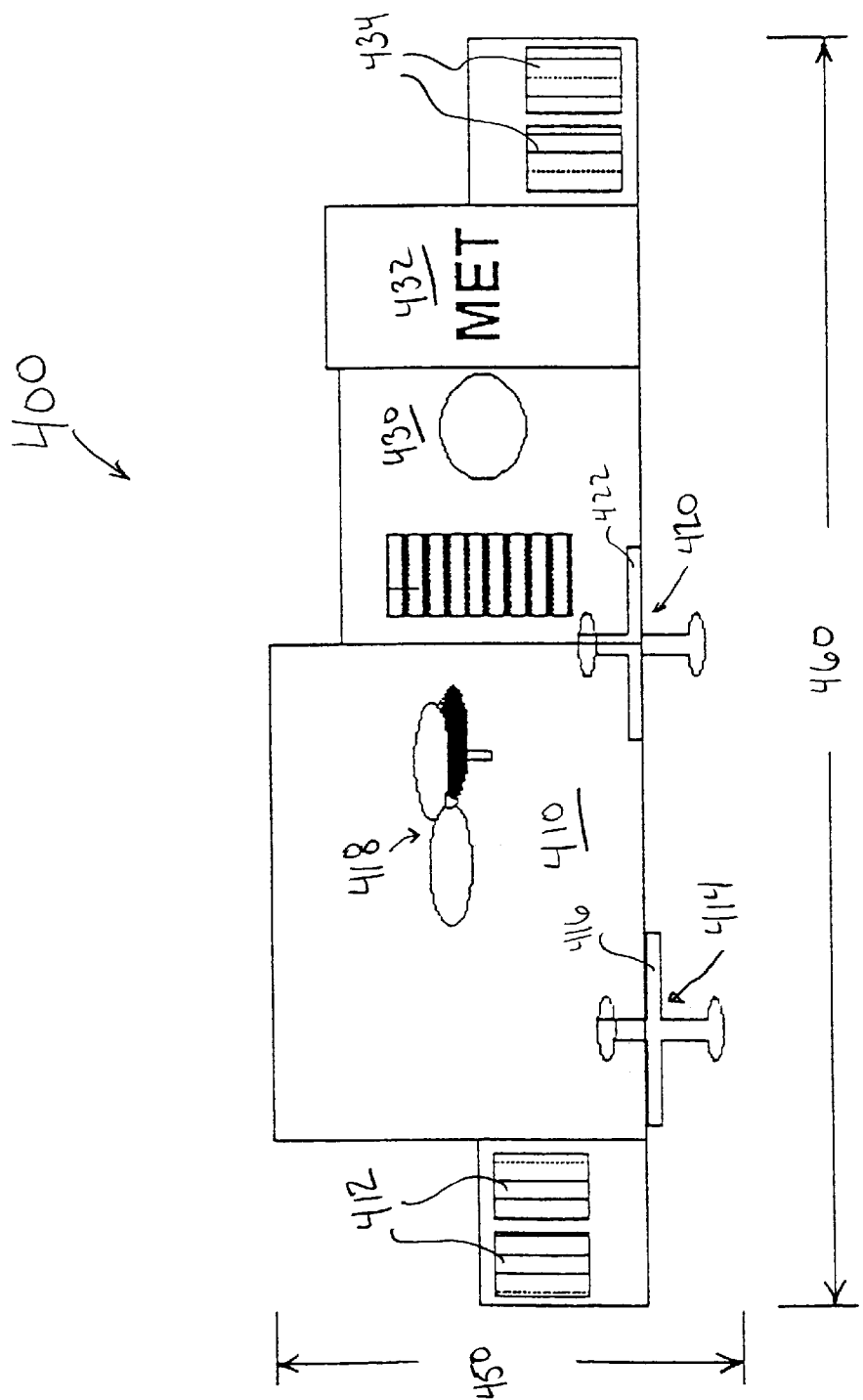
FIG. 4 depicts an edge profile/polish cluster tool according to the present invention.

Turning now to FIG. 4, an exemplary second module comprising an edge profile and edge polishing module will be described. Second module 400 again includes a clean room environment 410 to facilitate clean operations. Second module 400 has a portal 412 for receiving wafers to be processed. Again, in one embodiment, portal 412 is one or more FOUPs. A robot or other transfer device 414 operates to take a wafer from portal 412 and transfer the wafer to an edge profiler/polisher 418. Edge profiler/polisher 418 may comprise one device, or two separate devices with the first device for profiling and the second device for polishing. Transfer device 414 may travel down a track 416 to permit proper placement of the wafer in the edge profiler/polisher 418.

The edge of the wafer is profiled and polished as described in conjunction with FIG. 2. In one embodiment, edge profiling removes about ten (10) microns to about fifty (50) microns of material from the diameter of the wafer, with a resultant diameter tolerance of about $+/-0.5$ $\mu$. After edge profiling and polishing, a transfer device 420 operates to transfer the wafer to a cleaner 430. Again, transfer device 420 may travel on a track 422 to place the wafer in cleaner 430. Cleaner 430 may comprise a mixture of dilute ammonia, peroxide, and water, or an ammonia peroxide solution and soap, followed by an aqueous clean, and the like.

Subsequent to cleaning in cleaner 430, the wafer is transferred to a metrology station 432 at which wafer metrology is examined. An out-portal 434 is positioned to receive wafers having successfully completed processing through second module 400. In one embodiment, portal 434 is a FOUP which collects wafers meeting desired specifications. Again, rejected wafers are set aside in a separate area or FOUP.

Second module 400 has a compact configuration similar to first module. In one embodiment, second module 400 has a width 450 of about 7 feet 6 inches and a length 460 of about 22 feet 11 inches. In another embodiment, second module 400 has a footprint between about ninty (90) square feet and about one hundred and fifty (150) square feet. The module 400 shown in FIG. 4 may be used to carry out process step 222 depicted in FIG. 2. In one embodiment, second module 400 processes about thirty (30) wafers per hour. In another embodiment, second module 400 is adapted to process between about twenty-nine (29) and about thirty-three (33) 300 mm wafers per hour. In still another embodiment, second module 400 processing occurs before first module 300 processing. In this manner, edge profile and/or edge polishing occurs before wafer grinding.

Figure 5A:
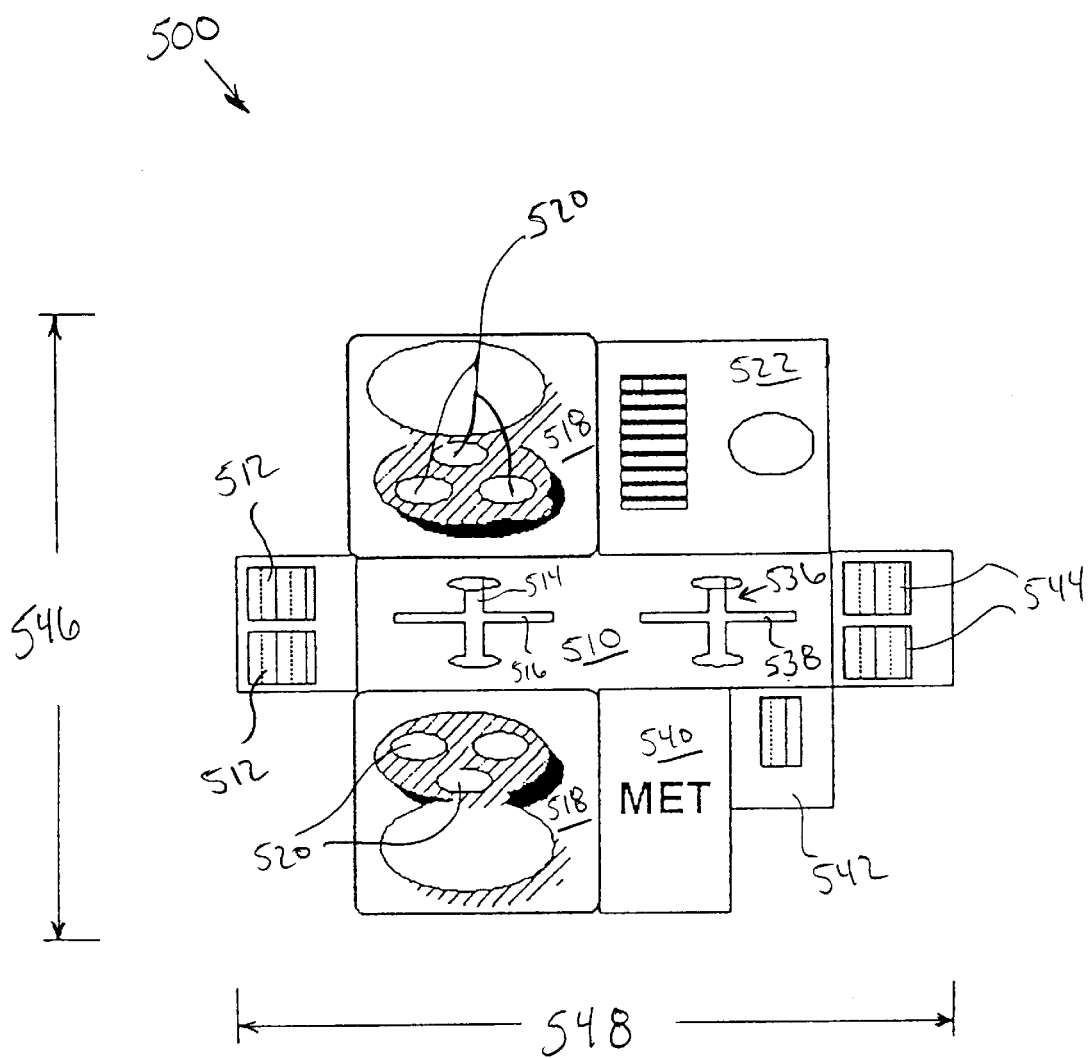
FIGS. 5A and 5B depict double side polish cluster tools according to the present invention.

FIG. 5A depicts a third module 500 comprising a double side polisher for use in process step 224 shown in FIG. 2.

Module 500 again includes an in-portal 512 which may be one or more FOUPs in one embodiment. Wafers are received in portal 512 and transferred within a clean room environment 510 by a transfer device 514. Transfer device 514, which in one embodiment is a robot, may travel along a track 516 to deliver the wafer to one or more double side polishers (DSP) 518.

As shown in FIG. 5A, double side polisher 518 accommodates three wafers 520 within each polisher. It will be appreciated by those skilled in the art that a greater or fewer number of wafers may be simultaneously polished within DSP 518. Prior art double side polishing (DSP) typically polishes a batch of ten or more wafers at a time in a double side polisher. The polisher initially only contacts the two or three thickest wafers due to their increased height within the DSP machine. Only after the upper layers of the thickest wafers are removed by polishing, are additional wafers polished within the batch. As a result, the batch mode polishing takes longer, and uses more polishing fluids and deionized water than in the present invention.

Hence in one preferred embodiment of the present invention, three wafers are polished simultaneously. Subsequent to polishing on polisher 518, the wafers are transferred via a transfer device 536, traveling on track 538 to a buffer station 522. Thereafter, the wafers are buffed, cleaned and dried. Either prior to or after processing through station 522, or both, wafers are tested at a metrology station 540. For wafers meeting desired specifications, transfer device 536 transfers those wafers to an out-portal 544, again, one or more FOUPs in one embodiment. Wafers which do not meet specifications are placed in a reject FOUP 542.

As with prior modules, the third module 500 has a compact footprint. In one embodiment, module 500 has a width 546 that is about 13 feet 11 inches and a length 548 that is about 15 feet 11 inches. In another embodiment, third module 500 has a footprint between about one hundred (100) square feet and about one hundred and eighty (180) square feet. Third module 500 may have a different footprint within the scope of the present invention.

In one embodiment, DSP 518 removes about twelve (12) microns of wafer thickness from both sides combined, at a rate of about 1.25 to 2.0 microns per minute. DSP 518 operates on a twelve (12) minute cycle time per load. Hence, in one embodiment, two DSPs 518 process about thirty (30) wafers per hour. In another embodiment, third module 500 is adapted to process between about twenty-nine (29) and about thirty-three (33) 300 mm wafers per hour. It will be appreciated by those skilled in the art that DSP 518 process times, third module 500 throughput, and other parameters may vary within the scope of the present invention. For example, additional DSPs 518 may be added to increase module 500 throughput. In one embodiment, wafer metrology tested at metrology station 540 is fed back to DSPs 518 to adjust DSP 518 operation as needed to produce desired wafer metrology.

Figure 5B:
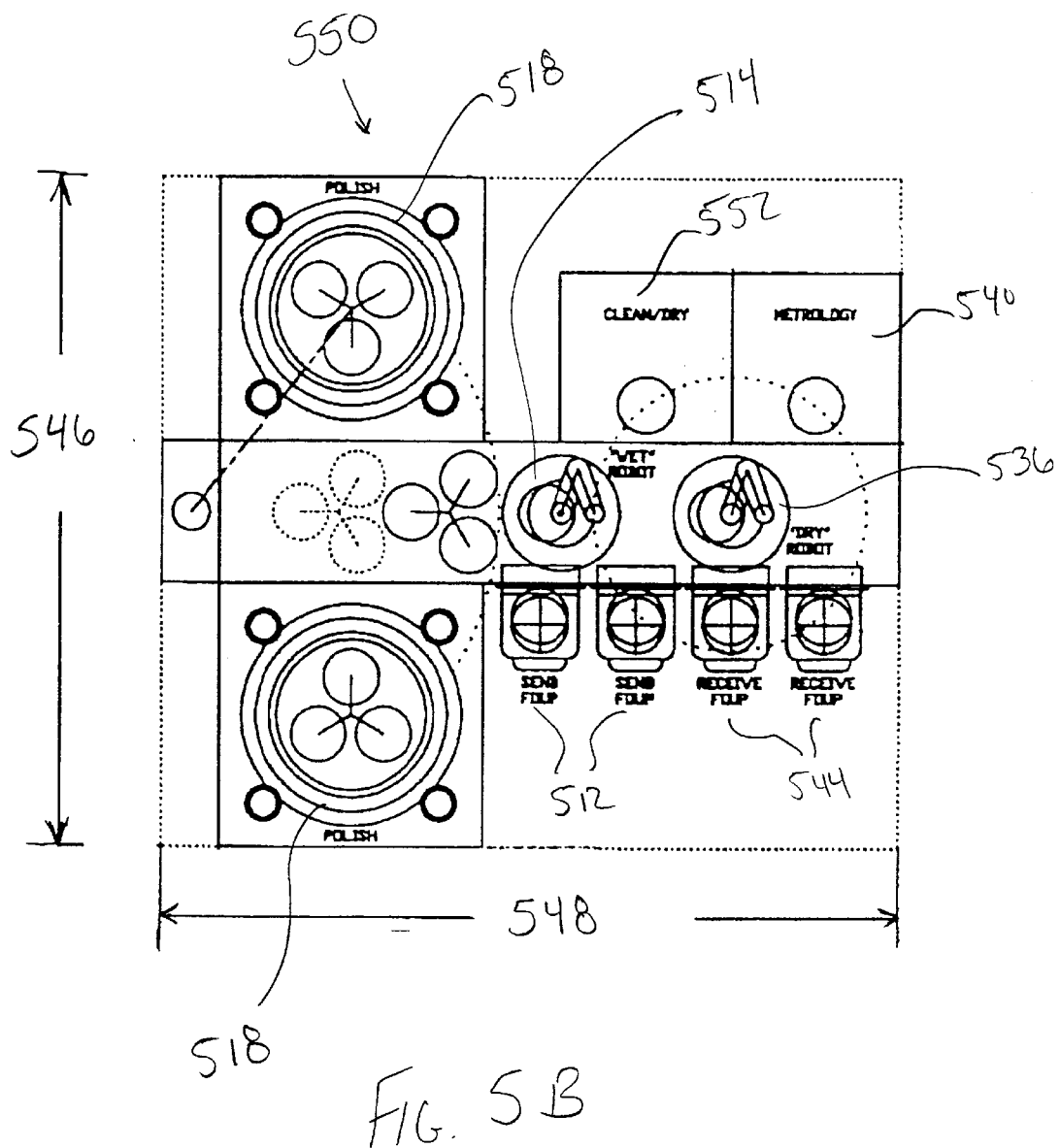

FIG. 5B depicts an alternative embodiment of a third module according to the present invention. As shown in FIG. 5B, third module 550 comprises a double side polisher for use in process step 224 shown in FIG. 2, as well as several other components shown in FIG. 5A. As a result, like components are identified with like reference numerals. Module 550 includes a clean/dry station 552 for wafer cleaning and drying subsequent to wafer polishing in polisher 518. Transfer devices 514 and 536, shown as a wet robot and a dry robot, respectively, operate to transfer wafers within module 550. In one embodiment, transfer device 514 travels on a track, groove, raised feature or the like to reach several processing stations and portals 512, while transfer device 536 operates from a fixed base.

While module 500 in FIG. 5A is a flow through module, with wafers received by module 500 at one side and exiting from an opposite side, module 550 in FIG. 5B groups portals 512 and 544. Again, such a grouping of in and out portals facilitates access to module 550 from a single point or side. In one embodiment, a buffer or reject FOUPS (not shown) also is grouped with portals 512 and 544. Alternatively, one or more of portals 512 and 544 may operate as a reject FOUPS.

Third module 550, in one embodiment, has a compact footprint with a width 546 at the widest point of about one hundred and forty two (142) inches and a length at the longest point of about one hundred and fifty-five inches (155).

Figure 6:
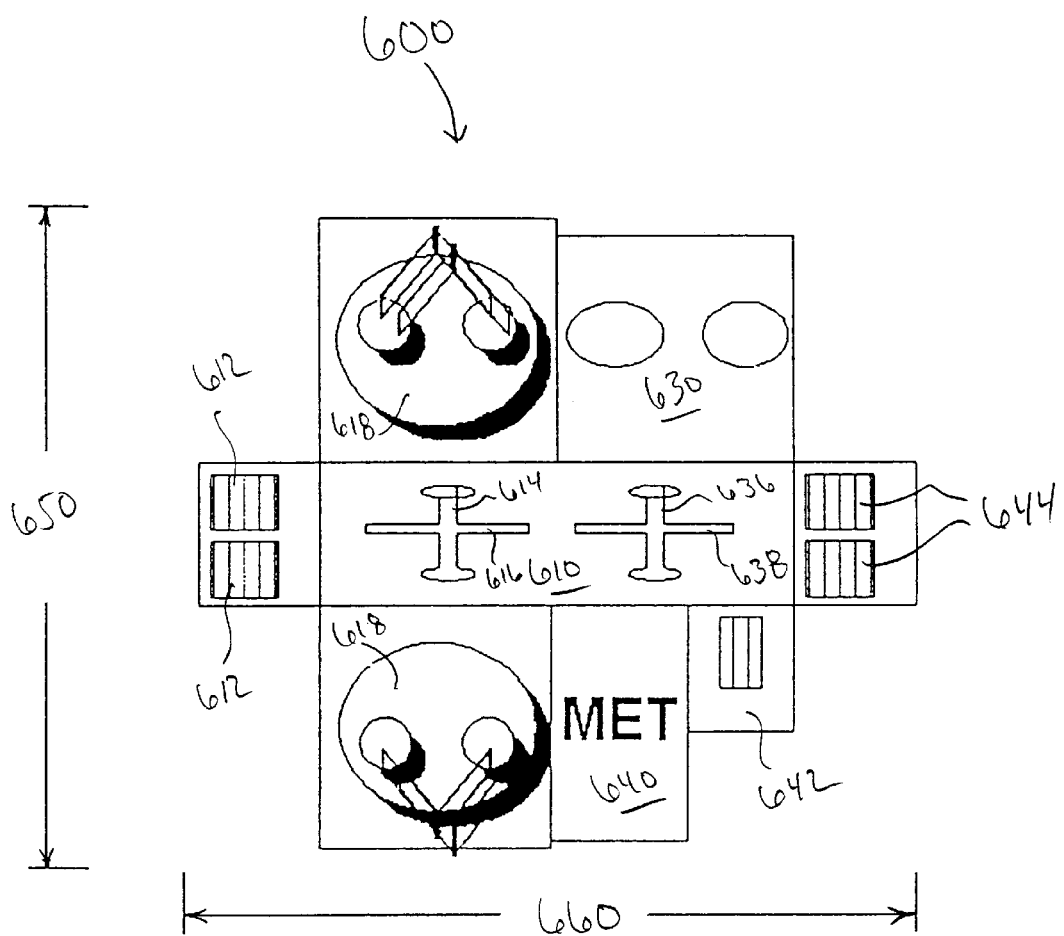
FIG. 6 depicts a finish polish cluster tool according to the present invention.

Turning now to FIG. 6, a fourth module 600, comprising a finish polish cluster, will be described. Fourth module 600 in one embodiment will be used for process step 226 shown in FIG. 2. As with the prior modules, fourth module 600 defines a clean room environment 610 which has ingress and egress through one or more portals or FOUPs. For example, an in-portal or FOUP 612 receives a plurality of wafers for finish polishing. Wafers are removed from FOUP 612 and transferred by a transfer device 614 along a track 616 to a finish polisher 618. While two finish polishers 618 are depicted in FIG. 6, a larger or smaller number of polishers 618 may be used within the scope of the present invention.

Wafers are finish polished for about five (5) to six (6) minutes within finish polisher 618 in an embodiment. Wafers that have undergone finish polishing are transferred to a single wafer cleaner 630 by a transfer device 636. Again, transfer device 636 in one embodiment comprises a robot that travels along a track 638. After wafer cleaning at cleaner station 630, wafer metrology is again tested at a metrology station 640. In one embodiment, metrology processing within fourth module 600 uses a feedback loop to provide data to finish polishers 618 as a result of wafer metrology testing. In one embodiment, the feedback loop is of sufficiently short duration to permit adjustments to the finish polisher process prior to the polishing of the next wafer after the wafer being tested. Wafers which do not meet specification are placed in a reject FOUP or portal 642 for proper disposal. Wafers meeting specifications will be placed in an out-portal or FOUP 644 for subsequent processing, packaging and shipping.

Fourth module 600, in one embodiment, has a width 650 of about 14 feet 0 inches and a length 660 of about 16 feet 0 inches. In another embodiment, fourth module 600 has a footprint between about one hundred (100) square feet and about one hundred and eighty (180) square feet. Again, as with all prior modules, the exact size may vary within the scope of the present invention. In one embodiment, fourth module 600 processes about thirty (30) wafers per hour. In another embodiment, fourth module 600 is adapted to process between about twenty-nine (29) and about thirty-three (33) 300 mm wafers per hour.

In one embodiment, the four modules 300, 400, 500 and 600, or their alternative embodiments, and ancillary equipment take up about 4,000 square feet or less of a production facility. This total footprint is much smaller than required for prior art equipment performing similar processes. As a result, apparatus, systems and methods of the present invention may be incorporated more readily in smaller facilities, or as part of a device fabrication facility in which circuit devices are formed. In this manner, the time and cost of packing and shipping, as well as unpacking and inspecting, are avoided. The costs of packing and shipping can, for example, save on the order of about two (2) percent or more of the total wafer processing costs.

Figure 7:
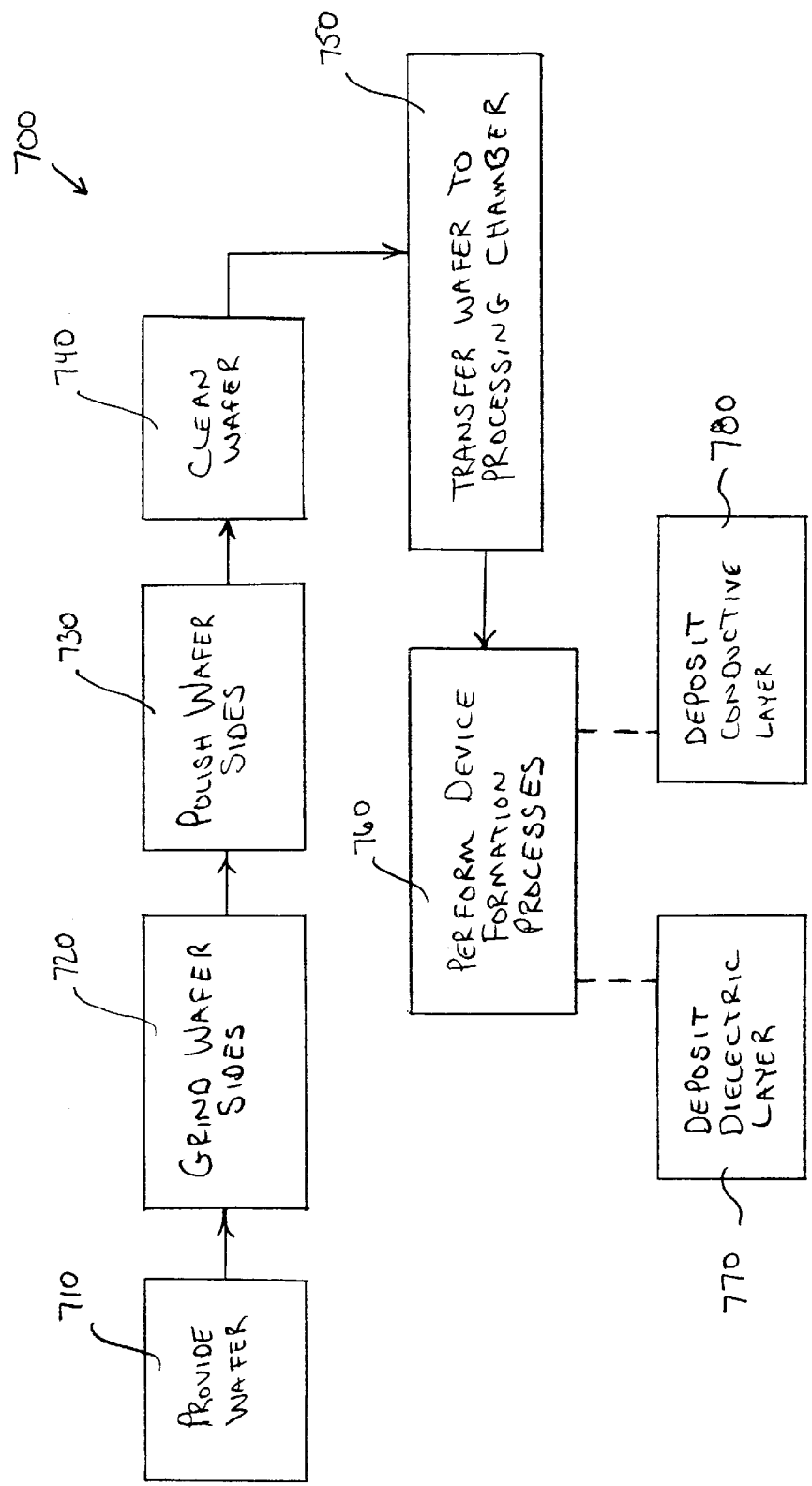
FIG. 7 is a simplified flow diagram of methods of the present invention.

A schematic of a method of processing wafers 700 according to the present invention is shown in FIG. 7. Method 700 includes providing a wafer (step 710), which typically has thickness variations between its two primary surfaces. The wafer sides are ground (Step 720) and polished (Step 730). The wafer then undergoes a cleaning process (Step 740), although additional cleaning processes may be used throughout the method. The wafer, having desired specifications, is then transferred to a wafer processing chamber (Step 750). The wafer processing chamber is located in a same facility as the equipment for performing the other method steps, including grinding, polishing and cleaning. In this manner, the transferring of the wafer may occur by way of a robot or other transfer mechanism within the facility. The present invention reduces or eliminates the need for additional cleaning, packing, shipping, unpacking, cleaning and inspecting steps prior to placing the wafer in a processing chamber. As a result, a more efficient, streamlined process is realized.

Once the wafer has been positioned in the processing chamber, device formation processes are performed on the wafer (Step 760). These processes may include, but are not limited to, depositing a dielectric layer on the wafer (Step 770), depositing a conductive layer on the wafer (Step 780), performing thermal oxidation, etching, photolithography, annealing, electroplating and a number of other processes known to those skilled in the art.

The invention has now been described in detail for purposes of clarity and understanding. However, it will be appreciated that certain changes and modifications may be practiced within the scope of the appended claims. For example, the modules may have different layouts, dimensions and footprints than as described above. The modules also may have a wide range of wafer throughput capabilities, due in part to the size and number of stations within each module. Additionally, transfer devices that have been described as traveling or fixed, may also be fixed or traveling, respectively.

What is claimed is:

1. A method of processing a wafer, comprising:
   providing a wafer having initial thickness variations between two surfaces of said wafer;
   processing said wafer through a first cluster tool module, said first cluster tool module comprising apparatus for performing a grinding process and said processing therethrough includes said grinding process, the first cluster tool module defining a first clean room environment;
   processing said wafer through a second cluster tool module, said second cluster tool module comprising apparatus for performing a double side polish (DSP) process, and said processing therethrough includes said DSP process, the second cluster tool module defining a second clean room environment separate from the first clean room environment;
   processing said wafer through a third module, said third module comprising an apparatus for performing a finish polish process, and said processing therethrough includes said finish polish process;
   cleaning said wafer after said processing through said third module; and
   after the cleaning, inserting the wafer into a wafer processing chamber within a same facility as that containing said first, second and third modules, the processing chamber adapted for performing a circuit device formation process.

2. The method of claim 1 further comprising testing said wafer metrology and wherein said inserting said wafer comprises inserting said wafer only if said wafer has a desired flatness profile.

3. The method of claim 1 wherein said providing, said processing through said first module, said defining, said processing through said second module, said processing through said third module, said cleaning and said inserting occur in the order listed in claim 1.

4. The method of claim 1 wherein said wafer has a total thickness variation (TTV) between said two surfaces of less than about 0.3 microns prior to said transferring.

5. The method of claim 1 wherein said wafer has a SFQR of less than 0.12 microns prior to said transferring.

6. The method of claim 1 further comprising performing a circuit device fabrication process on said wafer within said processing chamber.

7. The method of claim 6 wherein said circuit device fabrication process is selected from a conductive layer deposition process and a dielectric layer formation process.

8. The method of claim 1 wherein said first module has a footprint between about ninety (90) square feet (sqft) and about one hundred and fifty (150) sqft, and has a capacity of processing between about twenty-nine (29) wafers and about thirty-three (33) wafers therethrough per hour.

9. The method of claim 1 wherein said second module has a footprint between about one hundred (100) square feet (sqft) and about one hundred and eighty (180) sqft, and has a capacity of processing between about twenty-nine (29) wafers and about thirty-three (33) wafers therethrough per hour.

10. The method of claim 1 wherein said third module has a footprint between about one hundred (100) square feet (sqft) and about one hundred and eighty (180) sqft, and has a capacity of processing between about twenty-nine (29) wafers and about thirty-three (33) wafers therethrough per hour.

11. The method as in claim 1 further comprising inspecting the wafer after the cleaning and before the inserting into the wafer process chamber, and wherein the wafer is inserted into the wafer processing chamber only if the wafer has a desired set of characteristics so that the wafer does not require a second inspecting step prior to the inserting the wafer into the wafer processing chamber.

12. The method as in claim 1 wherein the third module comprises a third cluster tool module defining a third clean room environment.

13. A method of processing a wafer prior to device formation thereon, said method comprising:
   providing a wafer having first and second surfaces with thickness variations therebetween;
   grinding said first and second wafer surfaces;
   polishing said first and second wafer surfaces;
   cleaning said wafer;
   inspecting the wafer to confirm the polishing of the first and second wafer surfaces and the cleaning of the wafer defines a first wafer surface adapted to receive a first circuit device layer thereon; and
   after the inspecting, inserting the wafer into a wafer processing chamber for device formation processes;
   wherein the grinding, the polishing, the cleaning, the inspecting and the inserting all occur in a same circuit device fabrication facility so that the wafer does not require a second inspecting step prior to the inserting the wafer into the wafer processing chamber.

14. The method of claim 13 wherein the inserting comprises inserting said wafer into said wafer processing chamber with a robot.

15. The method of claim 13 further comprising depositing a dielectric layer on said wafer within said processing chamber.

16. The method of claim 13 further comprising depositing a conductive layer on said wafer within said processing chamber.

17. The method of claim 13 further comprising defining an edge profile of said wafer after said grinding.

18. A method of processing a wafer prior to device formation thereon, the method comprising, in order:

provided a wafer having initial thickness variations between two surfaces of the wafer;

performing a grinding process on the wafer in a first cluster tool module, the first cluster tool module defining a first clean room environment;

performing a polishing process on the wafer in a second cluster tool module, the second cluster tool module defining a second clean room environment;

performing a finish polish process on the wafer;

cleaning the wafer;

inspecting the wafer for a desired set of characteristics; and inserting the wafer into a wafer processing chamber adapted to perform a circuit device formation process if the wafer has the desired set of characteristics;

wherein the wafer processing chamber is disposed in a same facility as that containing the first, second and third modules.

19. The method as in claim 18 wherein the wafer is adapted to maintain the desired set of characteristics between the inspecting and the inserting so that a second inspecting process is not performed.

* * * * *